(12) United States Patent
Chen

(10) Patent No.: US 6,406,940 B1
(45) Date of Patent: Jun. 18, 2002

(54) METHOD AND APPARATUS FOR STACKING IC DEVICES

(75) Inventor: Philip H. Chen, Beaverton, OR (US)

(73) Assignee: Intermedics Inc., Angleton, TX (US)

( * ) Notice: Subject to any disclaimer, the term of this patent is extended or adjusted under 35 U.S.C. 154(b) by 0 days.

(21) Appl. No.: 09/638,185

(22) Filed: Aug. 14, 2000

(51) Int. Cl.[7] .............................................. H01L 21/44
(52) U.S. Cl. ...................... 438/109; 438/106; 438/109; 438/14; 438/15
(58) Field of Search ............................... 438/106, 109; 257/676

(56) References Cited

U.S. PATENT DOCUMENTS

| | | | |
|---|---|---|---|
| 4,654,694 A | 3/1987 | Val | 357/74 |
| 5,239,447 A | * 8/1993 | Cotues et al. | 361/744 |
| 5,399,898 A | * 3/1995 | Rostoker | 257/499 |
| 5,468,992 A | 11/1995 | Kanekawa et al. | 257/676 |
| 5,954,751 A | 9/1999 | Chen et al. | 607/5 |
| 5,956,575 A | * 9/1999 | Bertin et al. | 438/110 |
| 6,034,780 A | * 3/2000 | Kato | 356/400 |
| 6,087,722 A | * 7/2000 | Lee et al. | 257/723 |
| 6,150,724 A | 11/2000 | Wenzel et al. | 257/777 |

* cited by examiner

Primary Examiner—Charles Bowers
Assistant Examiner—Scott B. Geyer
(74) Attorney, Agent, or Firm—Schwegman, Lundberg, Woessner & Kluth, P.A.

(57) ABSTRACT

Disclosed is a method for stacking semiconductor chips, including positioning a first chip and manipulating a second chip to a distance above the first chip that is no greater than a selected distance, and releasing the second chip to drop into a stacked configuration on the first chip. The selected distance is such as to avoid damage to either of the chips. Embodiments are disclosed for setting the drop distance of the second chip within the selected distance.

19 Claims, 3 Drawing Sheets

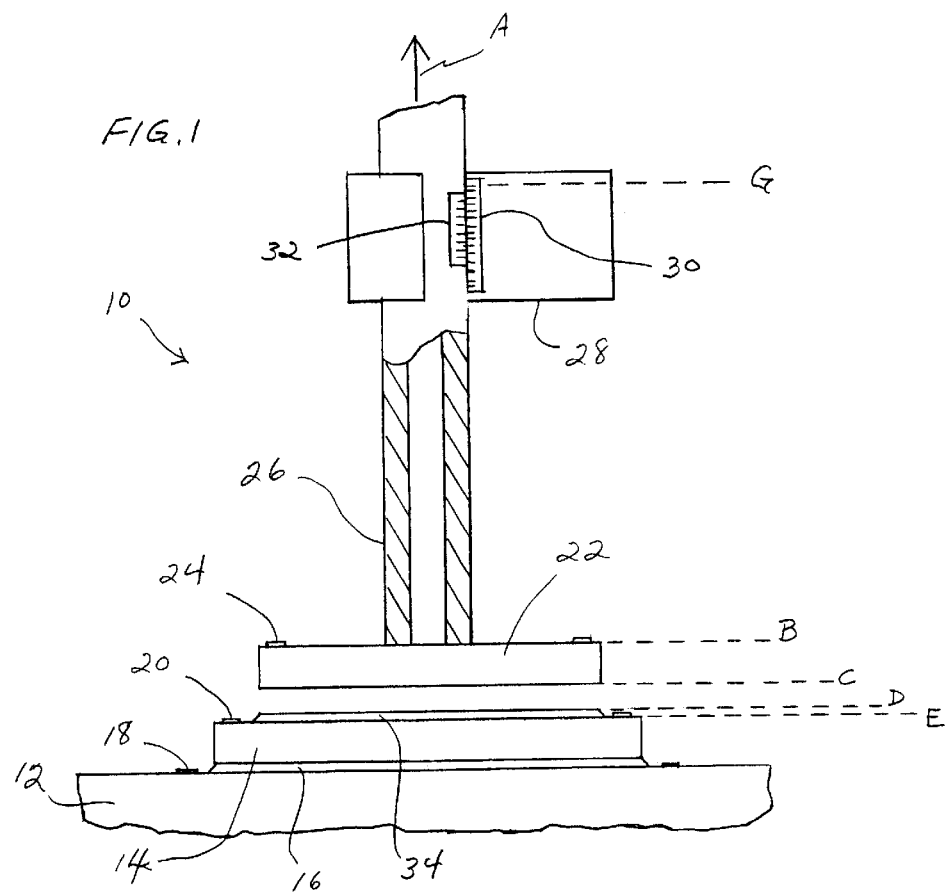
FIG. 1
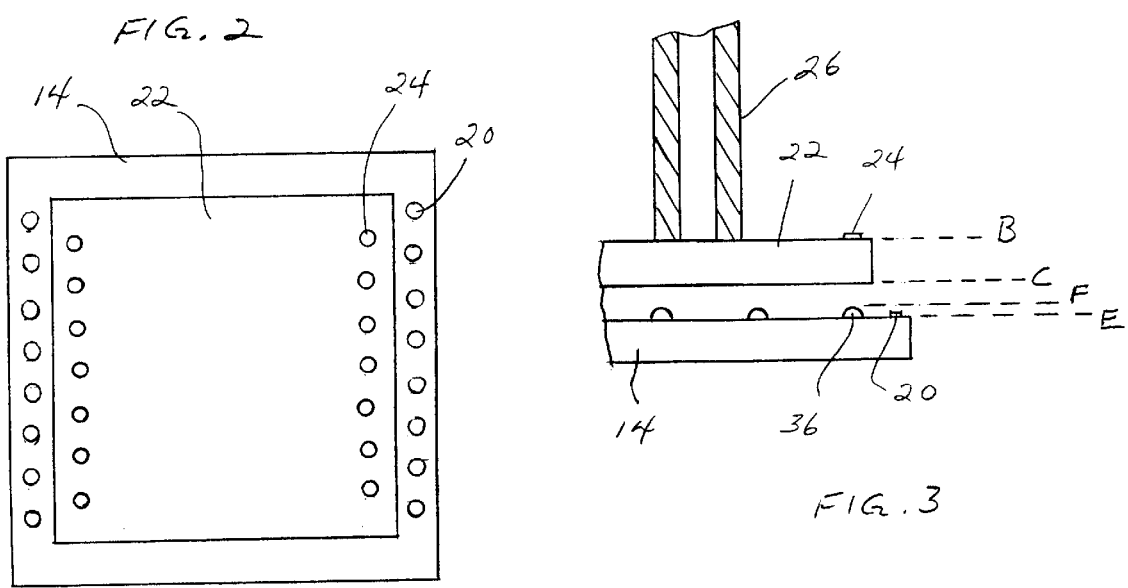
FIG. 2
FIG. 3

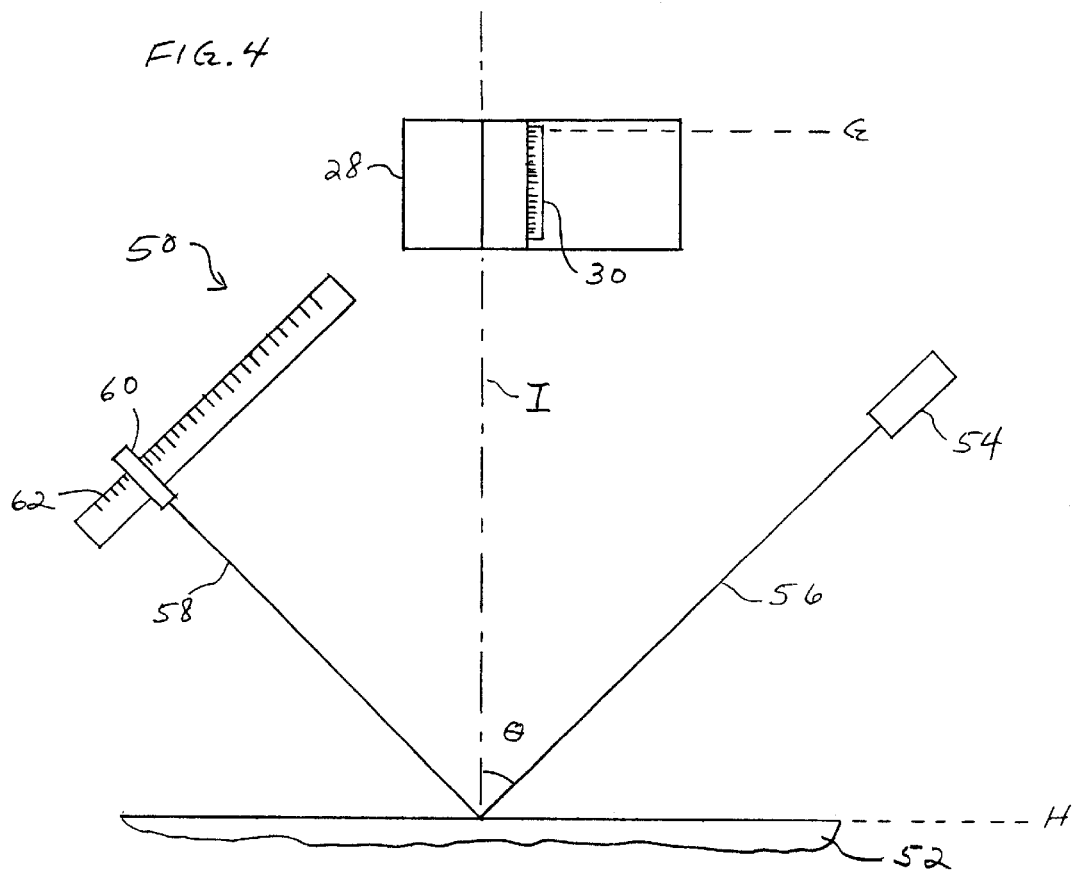
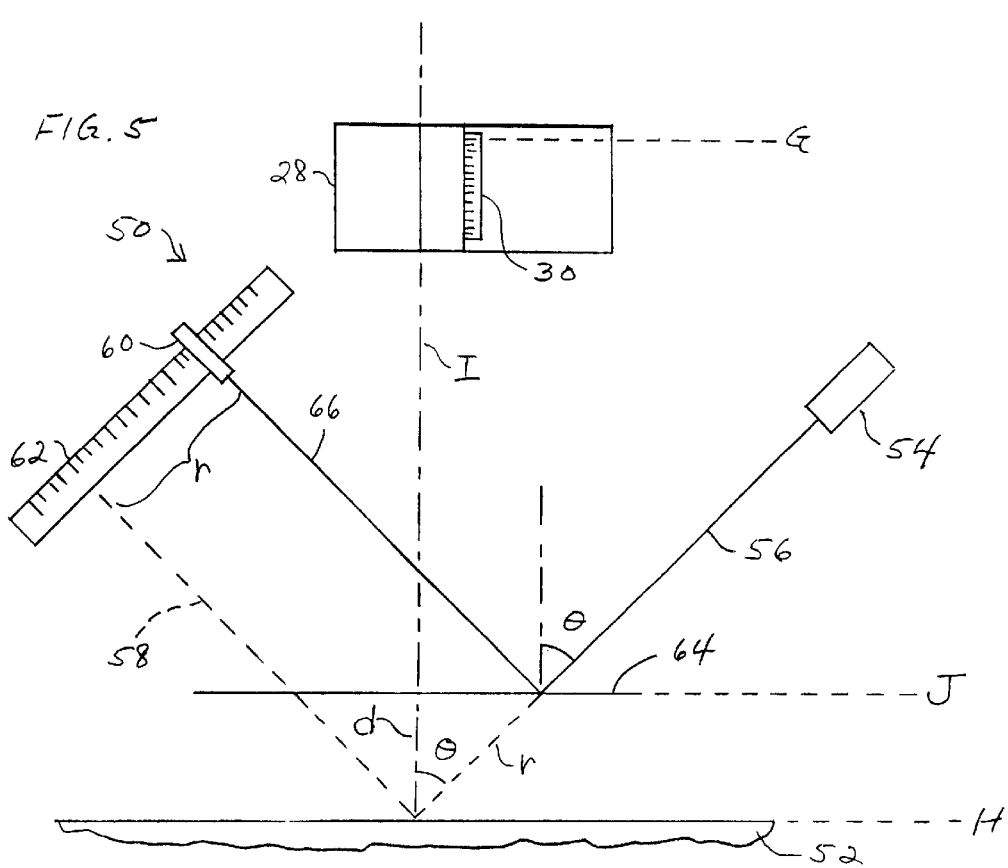

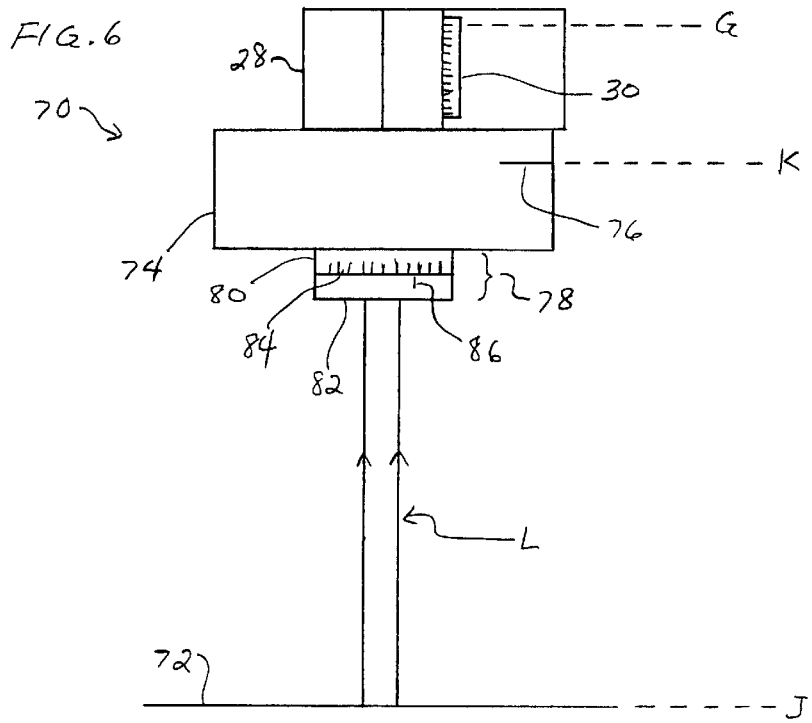
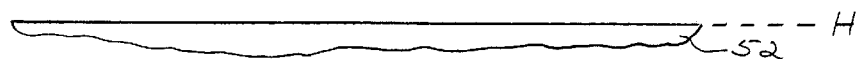
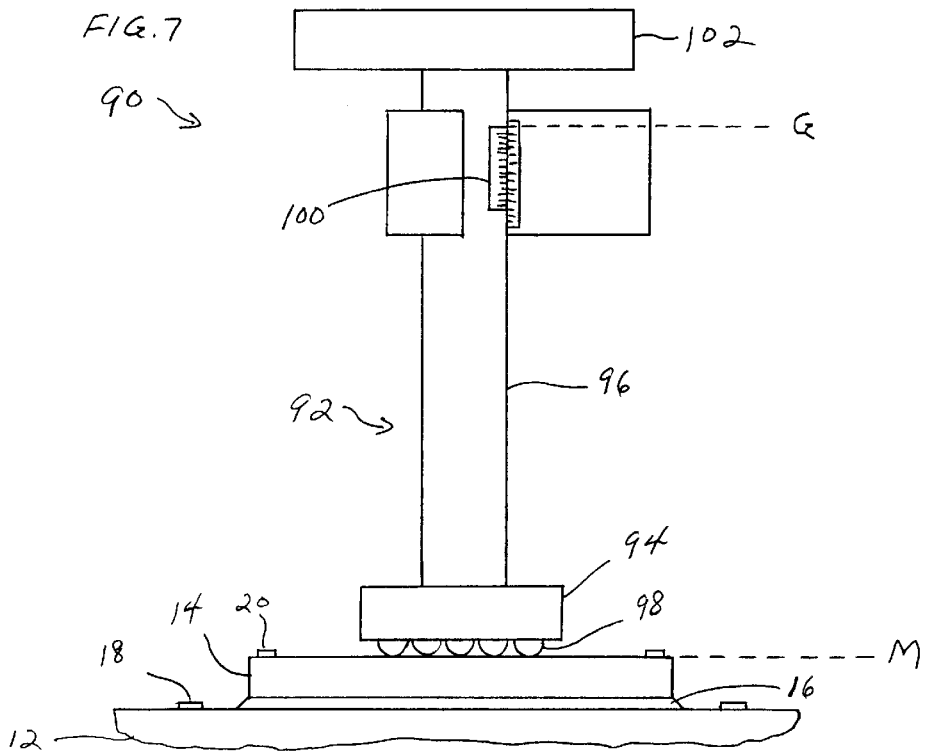

METHOD AND APPARATUS FOR STACKING IC DEVICES

TECHNICAL FIELD

The present invention relates generally to the manufacturing of printed circuit boards or the like, containing integrated circuits (ICs) and other semiconductor devices. More particularly, the present invention pertains to techniques and apparatus for stacking integrated circuits.

BACKGROUND OF THE INVENTION

Modern electronic circuits are generally constructed on printed circuit boards, utilizing integrated circuits and other electrical components mounted on the boards and appropriately interconnected. With such integrated circuits comprising one or more semiconductor devices, such electronic circuitry provides the advantages of relatively sturdy and reliable construction, reduced lengths of component interconnections with consequent reduced impedance and electrical signal traces, and enhanced miniaturization. These features of modern circuitry find particular application to the field of implantable medical devices, such as heart pacemakers and defibrillators. For example, smaller implant devices require smaller incisions, and provide less bulk for the patients receiving the implants to endure. Also, the patients may receive greater benefit from an implant device that has enhanced capabilities made possible by an increase in the extent of the circuitry contained therein, particularly if the size of the circuit board is not increased.

A conventional printed circuit board provides a substrate made of plastic, ceramic, or other suitable material, and may be constructed of multiple layers of electrically conductive sheets mutually separated by electrically insulating layers. Conducting paths are selectively constructed in the conductive sheets, including traces located along the planes of the sheets, and conducting channels are formed passing through holes, or vias, in insulating layers to interconnect traces or terminals on different conducting layers. A variety of components, including semiconductor integrated circuits, or chips, may be mounted on the top planar surface of such a circuit board, for example, and electrically connected to the circuit by connection to pads, or terminals.

In the quest for miniaturization of printed circuit board components, particularly for such applications as implantable medical devices, it has been found that a chip can be stacked on another chip that is already mounted on a printed circuit board. The second, or upper, chip is positioned on the first, or lower, chip so as to not cover the connection pads on the first chip, or to be so close as to interfere with the making of connections to those pads. Then both chips may be wire-bonded, or otherwise connected, into the circuitry on the printed circuit board.

While electronic circuitry comprising integrated circuits and other semiconductor devices in the form of chips, or dies, may provide relatively sturdy and reliable components, the actual manufacture of such circuitry requires considerable care and delicacy of operation due, for example, to the fragile nature of such devices. In the process of stacking one chip on another, for example, the upper chip must be properly aligned with the lower chip; otherwise, if the upper chip is deposited even slightly rotated or laterally shifted out of alignment, it may interfere with the making of electrical connections to the pads on the lower chip. Further, such a misaligned upper chip may be damaged in the process of connecting the lower chip. Still further, either or both of the chips may be damaged if the upper chip is brought into contact with the lower chip in a tilted orientation, or with too much force, resulting in a collision between the two chips. Placing the second chip on the first chip manually, or by lowering the second chip using a mechanical device, can result in misalignment between the two chips, or a collision between them with resultant chip damage.

It has been found that chip damage can be avoided by positioning the second chip a short distance above the first chip, and dropping the second chip into place. Thus, the second chip falls under the force of its own weight, which is very small, being on the order of 0.013 g, and no damaging collision takes place. A vacuum tool may be used to pick up the second chip and position that chip over the first chip. Release of the vacuum allows the second chip to fall into place on the first chip. However, to maintain both the rotational alignment and the level orientation of the second chip as it falls through the air to contact the lower chip, the distance over which the second chip is dropped must be minimized, and the second chip must be released to fall without deflection. At the same time, however, the gap between the two chips before the upper chip is released to fall must be sufficient to avoid the possibility of an inadvertent collision between the two chips while the upper chip is still being held.

It would be desirable and advantageous to provide a technique for stacking one chip on top of another that avoids the possibility of damage to either of the two chips, and which enables the upper chip to be placed in proper alignment on top of the lower chip. Further, it would be desirable and advantageous to provide a technique for minimizing the distance the second chip is dropped while also reducing the possibility of a collision between the two chips while the upper chip is still being held. The present invention provides such technique, and avoids the problems discussed above.

SUMMARY OF THE INVENTION

The present invention provides a method for stacking semiconductor chips, and includes the steps of providing a vertical reference level, positioning a first chip below the reference level, determining the vertical distance between the reference level and a top level of the first chip, engaging and supporting a second chip, manipulating the second chip over the first chip, aligned with the first chip, with the vertical distance between the reference level and the level of the bottom of the second chip, compared to the vertical distance between the reference level and the top level of the first chip, being such that the vertical distance between the level of the bottom of the second chip and the top level of the first chip is no greater than a selected distance, and releasing the second chip to fall into a stacked configuration on the first chip.

The top level of the first chip is the level of the top of adhesive positioned on the top surface of the first chip. The step of determining the vertical distance between the reference level and the top level of the first chip includes either (a) the steps of applying adhesive to the top surface of the first chip, and then determining the vertical distance between the reference level and the top level of the first chip, that is, the level of the top of the adhesive, or (b) the steps of determining the vertical distance between the reference level and the top surface of the first chip, and then applying adhesive to the top surface of the first chip to a selected thickness, establishing the top level of the first chip as the level of the top of the adhesive.

The vertical distance between the reference level and the top level of the first chip may be determined by utilizing the angle at which light is reflected, or by utilizing autofocusing, or by utilizing mechanical sensing, for example.

The steps of manipulating the second chip may be performed using a scale fixed relative to the vertical reference level to determine the vertical distance between the vertical reference level and level of the bottom of the second chip.

The steps of engaging, supporting, manipulating, and releasing the second chip may be performed using a vacuum tube on the end of which the second chip is carried, and a scale whereby the vertical position of the second chip, carried by the vacuum tube, relative to the reference level may be determined. Alternatively, the steps of engaging, supporting, manipulating, and releasing the second chip may be performed using a mechanical grasping system.

BRIEF DESCRIPTION OF THE DRAWINGS

FIG. 1 is a side elevation, in partial section and partly schematic, of a first semiconductor chip, or IC device, mounted on a substrate, and a second semiconductor chip, or IC device, suspended by a vacuum tool over the first IC device for dropping onto an epoxy layer on the top surface of the first IC device;

FIG. 2 is a top plan view of the two semiconductor IC devices positioned as shown in FIG. 1;

FIG. 3 is a fragmentary side elevation of the two semiconductor IC devices and vacuum tool of FIG. 1, but with epoxy dots on the top surface of the first IC device rather than an epoxy layer;

FIG. 4 is a schematic diagram, in side elevation, of an arrangement for determining the relative vertical position of a surface using the angle of reflected light;

FIG. 5 is a diagram similar to FIG. 4, but with the addition of a surface whose relative vertical position is to be determined;

FIG. 6 is a schematic diagram, in side elevation, of an arrangement for determining the relative vertical position of a surface using autofocusing; and, FIG. 7 is a side elevation, partly schematic, of an arrangement for determining the relative vertical position of a surface using a strain gauge for mechanical sensing.

DETAILED DESCRIPTION OF THE INVENTION

The present invention is illustrated and described in several presently preferred embodiments.

In FIG. 1 an arrangement is shown generally at 10 for stacking a semiconductor chip, or IC device, on another semiconductor chip, or IC device, and utilizing the technique of the present invention. A substrate 12 is positioned on a base, or support, (not shown) of the apparatus. The substrate 12 may be a printed circuit board or any like instrument on which semiconductor chips may be mounted and electrically connected. A first semiconductor chip, or IC device, 14 is mounted on the substrate 12 by a layer of electrically insulating adhesive 16. Typically, the adhesive 16 may be a polymer, such as epoxy. Multiple electrical terminals, or pads, 18 are arranged on the top surface of the substrate 12 for electrical connection to various electrical paths (not shown) on and within the substrate comprising a portion of an electrical circuit. Multiple electrical terminals, or pads, 20 are also present on the surface of the first chip 14, and connect to elements on and within the chip itself. Thus, the chip 14 may be electrically connected to parts of the electrical circuit of the substrate 12 by leads (not shown) that connect terminals 20 of the chip 14 with terminals 18 of the substrate. Such leads may be soldered to the terminals 18 and 20, for example.

A second semiconductor chip, or IC device, 22 is shown positioned above, and aligned with, the first chip 14 so that the second chip may be lowered to, and mounted on, the first chip. The second chip 22 also features electrical terminals, or pads, 24 connected to elements on and within the second chip. After the second chip 22 is mounted on the first chip 14, both chips may be connected to parts of the electrical circuit of the substrate 12, as well as to each other, by electrical leads (not shown) connected, such as by soldering, to the terminals 20 of the first chip, the terminals 24 of the second chip, and the terminals 18 of the substrate.

FIG. 2 shows the second chip 22 aligned above the first chip 14 such that the edges of the second chip will not be positioned so closely to any of the terminals 20 of the first chip as to interfere with the process of subsequently connecting leads to these terminals. In the case illustrated, rotation, or shifting to the side, of the second chip 22 could cause such misalignment to interfere with the process of connecting leads to the terminals 20. While two rows of terminals 20 and 24 are illustrated on the chips 14 and 22, respectively, alignment between chips is important in general for any arrangement of terminals to avoid interfering with electrically connecting the terminals.

The second chip 22 is shown in FIG. 1 engaged and supported by a hollow tube 26 that is part of a vacuum device. The open bottom end of the vacuum tube 26 contacts the top surface of the second chip 22 as air is pumped from the opposite end of the tube as indicated by the arrow A to establish a vacuum within the tube, with a seal formed between the end of the tube and the top surface of the second chip. Sufficient pressure differential is provided across the seal between the second chip 22 and the bottom end of the tube 26 to overcome the weight of the second chip. Then, the second chip 22 may be lifted and maneuvered by manipulating the tube 26. When the second chip 22 is positioned to be released, air is allowed back into the vacuum tube 26, releasing the second chip to drop onto the first chip 14.

In view of the light weight of semiconductor chips, being on the order of 0.013 g, a low vacuum will generally be sufficient to support a chip by the vacuum tube 26, and any known technique suitable for providing and controlling such a low vacuum may be used. For example, a hand-operated bellows, or elastic bulb, communicating with the tube 26 may be used to provide the necessary vacuum. Further, in view of the low pressure differential needed, the seal between the top of the second chip 22 and the end of the tube 26 is readily formed between a smooth surface of the chip and a smooth end of the tube. The end of the tube 26 may be of a relatively soft material such as an elastomer to enhance the sealing ability of the contact between the tube end and the surface of the second chip 22.

The vacuum tube 26 is to be selectively manipulated, and to this end, a guide in the form of a bracket, or partial sleeve, 28 is symbolically shown. The guide 28 includes a graduated scale 30 along which a vernier 32 fixed to the tube 26 slides as the tube is raised or lowered relative to the guide. The vernier scale 30/32 may thus be used to determine the vertical position of the tube 26, and the distance of vertical movement of the tube. Any technique for manipulating the vacuum tube 26, and for determining its vertical position, may be utilized rather than the guide 28 and the vernier scale 30/32.

The vacuum tube 26 is manipulated to lower the second chip 22 toward the first chip 14 until a selected separation between the two chips is achieved. Then, the second chip 22 may be released from the tube 26 to drop the short distance onto the first chip 14. The smaller the distance the second chip 22 must fall, the less will be any possible deviation from a straight, vertical path the second chip will follow, or any possible tilting, sideways shifting, or rotation, the second chip may experience, due to air resistance. A short drop distance will thus avoid a damaging collision between the two chips 14 and 22, and will achieve a desired accuracy of placement of the second chip on the first chip. A vertical distance may thus be selected such that releasing the second chip 22 to fall through a drop distance no greater than the selected distance will insure stacking of the second chip on the first chip 14 without damage, and correctly aligned. For example, a drop distance of less than 0.010 in (0.0254 cm), will provide a placement accuracy of ±0.003 in (±0.00762 cm), and avoid damage to the chips 14 and 22. Any such distance man be selected as an upper limit to the drop distance that will insure accurate and damage-free stacking.

Before the second chip 22 is dropped through the controlled distance to be mounted on the first chip 14, electrically insulating adhesive is applied to the top surface of the first chip. Then, the falling second chip 22 bonds to the first chip 14 by contact with the adhesive. The adhesive may be a polymer, such as epoxy. The epoxy may be made sufficiently thixotropic by the addition of aluminum oxide as a filler. The filler not only renders the epoxy somewhat viscous, by will penetrate a protective glassivation layer, typically silicon nitride or silicon oxide, on the surface of either chip under the very low placement force, that is, less than 10 g, effected when the second chip 22 is dropped the short distance onto the first chip 14. Consequently, the second chip 22 readily bonds to the first chip 14 when the second chip falls through the controlled distance to contact the adhesive epoxy on the top surface of the first chip. The mounting of the second chip 22 on the first chip 14 is complete when the epoxy cures. In particular, an epoxy layer 34 is shown on the top surface of the first chip 14 in FIG. 1.

In FIG. 1, five vertical levels, or heights, are marked by dashed lines. The top surface of the second chip 22 is at level B, and the bottom surface of the second chip is at level C. The top of the epoxy layer 34 is at level D, and the top surface of the first chip 14 is at level E, which is also the level of the bottom of the epoxy layer. The thickness of the second chip 22 is fixed as the difference between levels B and C, regardless of the position of the second chip. Level E is fixed when the first chip 14 is positioned to receive the second chip 22. Level D is fixed when the epoxy 34 is applied to the top surface of the first chip 14, and that chip is so positioned to receive the second chip 22. In practice, the second chip 22 is lowered by manipulation of the vacuum tube 26 until the distance between the two levels C and D is the desired control distance through which the second chip is to fall to the epoxy layer 34. While the top surface of the first chip is at level E, the top level of the first chip with the adhesive 34 added, and the level to which the second chip 22 is to fall, is level D, the level of the top of the adhesive 34 on the first chip, and is referred to herein as the top level of the first chip.

FIG. 3 illustrates adhesive epoxy dots 36 positioned on the top surface of the first chip 14 as an alternative to the epoxy layer 34 of FIG. 1. The epoxy dots 36 may be of the same material used in the epoxy layer 34, for example, including an epoxy with a filler to achieve a degree of viscosity of the epoxy and to facilitate the bonding of the second chip 22 to the first chip 14 when the second chip falls through the control distance. In FIG. 3, the lines B, C, and E mark the same respective levels as in FIG. 1, and line F marks the level of the top of the epoxy dots 36 before the second chip 22 is dropped onto these dots. As in the case of the adhesive layer 34 in FIG. 1, the top surface of the first chip 14 in FIG. 3 is at level E, but the top level of the first chip in FIG. 3 is a level F, the level of the tops of the epoxy dots 36 on the top surface of the first chip.

It will be appreciated that the epoxy layer 34 of FIG. 1 as well as the epoxy dots 36 of FIG. 3 may be distorted, that is, flattened, when the second chip 22 bonds to the first chip 14.

An advantage of the present invention is the ability to move the second chip 22 close enough to the first chip 14, without touching the two chips together, and without touching the second chip to the adhesive on the top surface of the first chip, so that the second chip will fall straight and undeflected to the first chip, that is, to the epoxy on the top surface of the first chip. Thus, in FIG. 1, the difference in levels C and D is to be minimized, but left at greater than zero, and in FIG. 3, the difference in levels C and F is to be minimized, but left at greater than zero. To achieve this capability, the top level of the first chip 14, that is, the level of the top of the epoxy, being either level D or level F, must be ascertained, and the position of the bottom of the second chip 22 before that chip is released to fall, being level C, must be controlled.

The levels B-F may be determined relative to any convenient reference, such as the base (not shown) on which the substrate 12 is fixed. Another reference that is available is the scale 30 on the bracket 28. The zero on the scale 30 may be used as a reference point, and its vertical position thus defines a reference level, G in FIG. 1. The length of the tube 26 from the vernier 32 to the bottom end of the tube, as well as the thickness of the second chip 22, may be measured by any appropriate, known method. Then, with the second chip 22 supported on the bottom end of the vacuum tube 26, the vertical position of level C at the bottom of the second chip, relative to the reference level G of the reference point zero on the scale 30, may be known from the configuration of the vernier scale 30/32. The relative vertical position of the top of the epoxy layer 34, level D, and the position of the top of the epoxy dots 36, level F, that is, the top level of the first chip 14 in each case, can be determined according to techniques described below. The vertical position of the top level D or F of the first chip 14, relative to the scale 30 zero reference point at level G, may be determined directly, or the level E of the top surface of the first chip may be determined directly first. Then, in the latter case, controlling the application of the epoxy, that is, applying the epoxy to a predetermined thickness, yields the position of the top level of the first chip 14, being the level of the top of the epoxy layer, level D, or the top of the epoxy dots, level F. The vertical position of the bottom of the second chip 22, level C, is controlled by selectively positioning the tube 26 using the scale 30/32. Thus, the minimization of the distance between the bottom of the second chip 22, at level C, and the top level of the first chip 14, at either level D or level F, without the second chip contacting the epoxy layer 34 or the epoxy dots 36, may be achieved.

While a vacuum tube 26 is illustrated as a tool for positioning the second chip and releasing it to fall over a controlled distance to the first chip 14, it will be appreciated that other techniques, such as use of a mechanical grip, may be used to position and drop the second chip according to the present invention.

The relative vertical position of the top of the epoxy layer 34, level D, the tops of the epoxy dots 36, level F, or the top surface of the first chip 14, level E, may be determined by any technique that will be sufficiently precise to allow the minimization of the control drop distance, from level C to level D or level F, to less than 0.010 in (0.0254 cm), for example, and several such techniques are disclosed herein, and illustrated in FIGS. 4–7.

An arrangement for determining the vertical position of a surface, utilizing the angle at which light is reflected, is illustrated generally at 50 in FIG. 4. A base 52 provides a smooth, horizontal, top surface at level H. The base may be a table, or support, on which the substrate 12 of FIGS. 1 and 3 is to be located, for example. The vertical distance between the level H and the reference point zero on the scale 30 of the bracket 28, at level G, as shown in FIG. 1, may be known, for example, such as by any known measurement technique. Then, vertical distances measured relative to the level H will also be known relative to the reference level G.

A light source 54 directs a light beam 56 incident on the base 52 top surface at level H, from which the light beam is reflected as light beam 58. A light sensor 60 detects the reflected beam 58. With the top surface of the base 52 being horizontal, the angle of incidence θ, measured between the direction of propagation of the incident light beam 56 and the vertical direction indicated by a dashed line I, will equal the angle of reflection, measured between the direction of propagation of the reflected light beam 58 and the vertical dashed line I. The light sensor 60 is mounted for lateral movement along a scale 62 that is oriented so that the light sensor may so move in a path that is parallel to the direction of propagation of the incident light beam 56, and, therefore, perpendicular to the direction of propagation of the reflected light beam 58

A horizontal surface 64 has been added to the apparatus 50 in FIG. 5. The surface 64 may be the top surface of the first chip 14, or of the adhesive layer 34, with the chip mounted on a substrate 12, as in FIG. 1, for example, and the substrate supported on the base 52. The vertical position of the surface 64 is indicated to be at level J. The light beam 56 strikes the surface 64 at the same angle of incidence θ, and is reflected at this same angle in a reflected beam 66, which is laterally offset relative to the path of the reflected light beam 58 in FIG. 4. The light sensor 60 detects the reflected beam 66, with the light sensor moved to a new position along the scale 62 for this purpose. Dashed lines indicate the path the incident light beam 56 would continue on to intersect the top surface of the base 52, and the consequent reflected light beam 58, in the absence of the surface 64, as in FIG. 4. The difference in vertical position between the level H and the level J, being the perpendicular distance d between the top surface of the base 52 and the surface 64, determines the lateral offset r between the paths of the two reflected beams 58 and 66, and, therefore, the distance r the light sensor 60 must be moved along the scale 62 between the position of the light sensor to detect the reflected light beam 58 and the position to detect the reflected light beam 66. The angle θ before word is also the included angle between d and r in the right triangle formed between the top surface of the base 52 and the surface 64. Then, d is the given by r(cos θ), and r is read from the scale 62. Setting the angle θ before word at 45° before word yields d=0.70711(r), for example. The vertical distance of the level J from the reference level G set by the zero of the bracket scale 30 can be obtained by subtracting the distance d from the known vertical distance of the level H from the reference level G.

After the position of the level J relative to the reference level G is determined, the vacuum tube 26 is used to manipulate the second chip 22 as illustrated in FIG. 1. With the vertical position of level J relative to the reference level G known, with the thickness of the second chip 22 known, and with the distance of the bottom end of the vacuum tube 26, whose level is B, from the vernier 32 known, the vertical spacing between the level C of the bottom of the second chip and the level J can be obtained from the reading on the vernier scale 30/32 on the bracket 28 as the vacuum tube is selectively moved up and down through the bracket. The spacing between the bottom of the second chip 22 at level C and the top level of the first chip 14, say, at level J, is found by subtracting the distance between level C and level G, obtained with the vernier scale 30/32, from the distance between the level G and the level J. Thus, the vertical distance between the level C and the level J is adjusted until a desired chip drop distance is achieved, at which time the vacuum in the tube 26 is relieved and the second chip 22 falls toward the first chip 14.

As noted above, the surface 64 at level J may be the top of an adhesive layer, such as adhesive 34 on the top surface of the first chip 14 as shown in FIG. 1. If, however, the surface 64 is the top surface of the first chip 14, adhesive, such as the layer 34, or the epoxy dots 36 of FIG. 3, is applied to the surface 64 in a controlled manner to a predetermined thickness, after the relative vertical position of that surface is determined by the technique illustrated in FIGS. 4 and 5. Then, the thickness of the adhesive is subtracted from the vertical distance of the surface 64 at level J from the reference level G in setting the separation of the bottom of the second chip 22 at level C from the top of the adhesive within the selected chip drop distance. In either case, the level of the adhesive added to the top surface of the first chip 14 serves as the top level of the first chip, to which level the second chip is dropped.

The light produced by the light source 54 should be in a narrow beam in order to produce a narrow beam received at the light sensor 60. This narrowness of beam is required to produce a precise position along the scale 62 at which the reflected light can be detected, and thus produce a precise measure of the distance r along that sale. The light source 54 may be fitted with appropriate collimators, and the light sensor may be fitted either with collimators or a small aperture to thus provide the necessary sensitivity of measurement of the point at which the reflected light reaches the scale 62.

preferred apparatus for achieving the sensitivity and precision of measurement of the distance d includes a laser generator as the light source 54, and an appropriate laser sensor as the light sensor 60.

An arrangement for determining the vertical position of a surface, utilizing autofocusing, is illustrated generally at 70 in FIG. 6. As in the case of the arrangement 50 for determining vertical position illustrated in FIGS. 4 and 5, a base 52 provides a smooth, horizontal, top surface at level H. The base 52 may be a table, or support, on which the substrate 12 of FIGS. 1 and 3 is to be located, for example. The vertical distance between the level H and the reference point zero on the scale 30 of the bracket 28, at level G, as shown in FIG. 1, may be known, for example, such as by any known measurement technique. Then, vertical distances measured relative to the level H will also be known relative to the reference level G. When a horizontal surface 72 is added to the apparatus 70 at a vertical level J, measuring the vertical distance between the level H and the level J will yield the vertical distance between the reference level G and the level J. As in the case of the distance measuring arrangement 50 of FIGS. 4 and 5, the surface 72 may be the top surface of the first chip 14, or of an adhesive layer 34, with the chip mounted on a substrate 12, as in FIG. 1, for example, and the substrate supported on the base 52.

An autofocusing system 74 is shown positioned over the base 52, as indicated by the reference level K and as discussed below. The level K marks the vertical position of some selected feature fixed in the autofocusing system 74, such as a fiducial mark on the housing of the system as illustrated. The fiducial mark 76 may mark the location of the focal plane of the autofocusing system 74 along its housing, for example.

The autofocusing system 74 is illustrated schematically in FIG. 6, and may be any appropriate autofocusing type such as used in cameras, for example. An autofocusing system operates by adjusting the configuration of the camera lens system according to the distance to the object to be photographed. The autofocusing system thus ascertains the distance to the object, and signals, or controls, the lens system to move part of the lens system accordingly. Such movement of the lens system may involve rotation of a threadedly engaged portion of the lens system to effect linear movement thereof. In general, such autofocusing devices analyze light, indicate at L in FIG. 6, reflected from the object on which the device is to focus, utilizing light intensity sensors. If the ambient visible light is of insufficient intensity, the autofocusing device may direct brighter light toward the object, and analyze the reflection. Alternatively, an appropriate sensor may analyze infrared light from the object in the autofocusing system in the absence of sufficient visible light intensity.

The schematically illustrated autofocusing system 74 includes an adjustable lens system 78, including a fixed lens housing 80 and a movable lens housing 80. The lens housing 80 is threadedly mounted, and rotates to move the lens component contained therein longitudinally relative to the fixed lens housing 82 to bring the object from which light is received into focus. A scale 84 lines the edge of the fixed lens housing 80, and a reference mark 86 is positioned at the edge of the rotatable lens housing 82. The combination of the mark 86 and the scale 84 indicates the configuration of the lens system 78. As the autofocusing system 74 focuses on objects at different distances from the focal plane of the system at level K, for example, the configuration of the lens system 78 changes accordingly, with rotation of the movable lens housing 82, and movement of the mark 86 along the scale 84.

The scale 84 may be calibrated to indicate distances from the autofocus device 74, or at least increments in distance between objects in focus at different distances from the autofocus device. The position of the mark 86 along the scale 84 can then be noted to ascertain distances, or increments in distance, as the autofocus device 74 is focused on surfaces at various distances from the level K, for example.

The autofocus device 74 is used to determine the vertical position of the top level of the first chip 14 relative to the reference level G of the zero point on the bracket scale 30, for example. This process can be performed by positioning the autofocus device 74 a known distance above or below the reference level G, using the level K of the fiducial mark 76, and using the autofocus device, calibrated for direct measurement of distances, to make a direct measurement of the distance from the autofocus device to the surface at level J, and then subtracting from, or adding to, respectively, the measured distance between the autofocus device to the surface at level J the known distance between the level of the autofocus device and the reference level G.

Alternatively, the autofocus device 74 may be placed at any convenient and workable distance above the level H of the surface of the base 52 before the first chip 14 is in place. Then, the autofocus device 74 is focused on that surface at level H, and the position of the mark 86 along the sale 84 noted. The surface at level J is then established, and the autofocus device 74 focuses on the surface at that level J. The position of the mark 86 along the scale 84 is again noted. The calibration of the scale 84 for distance increments yields the difference in the distances of the autofocus device 74 to the surfaces at levels H and J, based on the two respective positions of the mark 86 along the scale 84. The thus determined distance increment is also the difference in the distance between the level H and the reference level G, and the distance between the level J and the level G. Subtracting the distance increment from the known distance between the level H and the level G yields the distance between the level J and the level G.

After the position of the level J relative to the reference level G is determined, the vacuum tube 26 is used to manipulate the second chip 22 as illustrated in FIG. 1. Again, the level at J may mark the top surface of the first chip 14, or of the top of adhesive positioned on the top surface of the first chip. In the former case, the thickness of adhesive then applied to the top of the first chip 14 is subtracted from the distance between the level J and the level G to determine the distance between the top of the adhesive, that is, the top level of the first chip, and the level G. In the latter case, the surface J at the top of the adhesive is the top level of the first chip 14.

Yet another variation of a camera autofocus device that may be employed as part of the present invention is an ultrasound distance measuring system, which may be represented by the autofocus device 74 in FIG. 6 as well. In the case of an ultrasound system, ultrasonic waves are generated by the autofocus device 74 and directed at a surface, such as the surface of the base 52 at level H, or the surface of the object 72 at level J. The sound waves are reflected back to the autofocus device 74, and the time required for the sound to make the round-trip between the autofocus device and the reflecting surface is used as a measure of the distance traveled. Thus, the time so measured is dependent on the distance between the autofocus device 74 and the surface at level H or the surface at level J. While no adjustable lens system 76 is employed, the ultrasound autofocus device may include a direct readout (not shown) of the distance between the autofocus device and the reflecting surface, that is, half the round-trip the sound traveled. Differences in distances between the ultrasound device and the surfaces at H and J may be determined and used as in the case of the light autofocus device noted above. Thus, distance information obtained using the ultrasound autofocus device may be used to ascertain the distance between the top level of the first chip 14 and the reference level G as in the case of the light autofocus system.

The vertical distance between the reference level G and the top level of the first chip 14, thus determined using one or another autofocusing system, is used in conjunction with readings of the vernier scale 30/32 in determining the vertical distance between the reference level G and the level of the bottom of the second chip 22, level C, to set the desired drop distance to the top level of the first chip, as discussed above.

An arrangement for determining the vertical position of a surface, utilizing mechanical sensing, is shown generally at 90 in FIG. 7. As in the arrangement of FIG. 1, a substrate 12 is positioned on a base, or support, (not shown) of the apparatus, and a first semiconductor chip, or IC device, 14 is mounted on the substrate by adhesive 16. Electrical terminals 18 are arranged on the top surface of the substrate 12, and electrical terminals 20 are arranged on the top surface of the chip 14, The vertical position, or level, of the top surface of the chip 14, indicated by a dashed line M, is to be determined so that a second semiconductor chip (not shown) may then be suspended above the first chip in a position for a safe and accurate drop of the second chip for mounting on the first chip. In particular, the level M is to be determined relative to the reference level G set by the zero on the scale 30 of the bracket 28, for example.

A mechanical sensing system shown generally at 92 is utilized to detect the vertical location of the top of the first chip 14 at level M. The mechanical sensing system 92 includes a laterally-extending head 94 attached at the lower end of a rod 96, which may pass through the bracket 28 of FIG. 1, for example. The bottom surface of the head 94 features multiple nubs 98 that make contact with the top surface of the chip 14 when the rod 96 with the head attached is lowered toward the chip. The nubs 98 may be made of rubber, for example, to insure that no mechanical damage occurs to the first chip 14 when the nubs make physical contact. The rod 96 is fitted with a vernier 100 that moves along the bracket scale 30 as the rod is raised and lowered relative to the bracket and, therefore, relative to the level M of the top surface of the chip 14. Thus, the vernier scale 30/100 may be read to identify the vertical position of the bottoms of the nubs 96, with prior knowledge of the distance between the nub bottoms and the vernier 100 on the rod 96.

The mechanical sensing system 92 further includes a strain gauge assembly, shown schematically at 102. As the rod 96 is slowly lowered, contact between the nubs 98 and a surface, such as the top surface of the chip 14, causes pressure on the rod, which is detected by the strain gauge 102. Then, the position of the vernier 100 relative to the bracket scale 30 yields a reading that is indicative of the vertical position of the surface with which the nubs 98 are in contact, relative to the reference level G. The mechanical sensing system 92 is then removed and an adhesive layer 34, or adhesive dots 36, of selected thickness applied to the top surface of the first chip 14. The thickness of the adhesive is subtracted from the distance of the level M from the level G as measured by the sensing system 92 to obtain the distance between the level G and the level of the top of the adhesive layer 34, at D in FIG. 1, or the top of the adhesive dots 36, at F in FIG. 3. The vacuum tube 26 is introduced through the bracket 28 as shown in FIG. 1, and used to support and manipulate the second chip 22 to a drop position over the first chip 14, as discussed above.

The strain gauge assembly 102 may be of any appropriate type that is sufficiently sensitive to detect contact between the nubs 98 and the surface to be located, without damaging that surface. A spring strain gauge, with a mechanical indicator, may be utilized, for example. Another type of strain gauge that may be employed is a piezoelectric strain gauge, which generates an electrical signal upon the application of mechanical stress to a piezoelectric crystal due to a force upon the nubs contacting the surface to be located, and transmitted along the rod 96. The electrical signal is used to indicate such contact. Also, the mechanical sensing system 92 may be constructed with the strain gauge assembly 102 located elsewhere along the rod 96 than as illustrated, such as at a position below the bracket 28, for example.

The present invention provides a method for stacking semiconductor chips in correct alignment while avoiding possible damage to the chips due to collisions, for example. The distance that one chip is allowed to drop onto another chip is set to be no greater than a specified distance that is selected to minimize such risk. Techniques are disclosed to determine the drop distance to be within the selected distance.

The foregoing disclosure and description of the invention is illustrative and explanatory thereof, and various changes in the method steps may be made within the scope of the appended claims without departing from the spirit of the invention.

What is claimed is:

1. A method for stacking semiconductor chips comprising the following steps:
   a. providing a vertical reference level;
   b. positioning a first semiconductor chip below the reference level;
   c. determining the vertical distance between the reference level and a top level of the first chip;
   d. engaging and supporting a second semiconductor chip;
   e. manipulating the second chip over the first chip, aligned with the first chip, with the vertical distance between the reference level and the level of the bottom of the second chip, compared to the vertical distance between the reference level and the top level of the first chip, being such that the vertical distance between the level of the bottom of the second chip and the top level of the first chip is no greater than a selected distance; and
   f. releasing the second chip to fall into a stacked configuration on the first chip.

2. A method as defined in claim 1 further comprising the step of applying adhesive to the top surface of the first chip to establish the top level of the first chip before releasing the second chip to fall.

3. A method as defined in claim 1 in which the top level of the first chip is the level of the top of adhesive positioned on the top surface of the first chip.

4. A method as defined in claim 3 wherein the step of determining the vertical distance between the reference level and the top level of the first chip further comprises the following steps:
   a. applying the adhesive to the top surface of the first chip; and
   b. determining the vertical distance between the reference level and the top level of the first chip.

5. A method as defined in claim 3 wherein the step of determining the vertical distance between the reference level and the top level of the first chip further comprises the following steps:
   a. determining the vertical distance between the reference level and the level of the top surface of the first chip; and
   b. applying the adhesive to the top surface of the first chip to a selected thickness.

6. A method as defined in claim 3 wherein the step of determining the vertical distance between the reference level and the top level of the first chip further comprises the following steps:
   a. providing a reference surface at a known distance below the reference level;
   b. providing a light beam incident on the reference surface at an angle of incidence θ between zero degrees and ninety degrees, and detecting the light beam reflected from the reference surface;
   c. positioning the first chip above the reference surface and below the reference level;
   d. providing the light beam incident on a surface provided by the first chip at the same angle of incidence θ, and detecting the light beam reflected from that surface provided by the first chip;

e. measuring the lateral offset of the light beam reflected from the surface provided by the first chip compared to the light beam reflected from the reference surface; and f. calculating the vertical distance between the reference surface and the surface provided by the first chip, utilizing the offset.

7. A method as defined in claim 6 wherein the steps of providing a light beam comprise providing a laser light beam.

8. A method as defined in claim 6 wherein the step of determining the vertical distance between the reference level and the top level of the first chip further comprises the following steps:

a. providing the top surface of the first chip as the surface provided by the first chip on which the light beam is incident; and b. thereafter, applying the adhesive to the top surface of the first chip to a selected thickness.

9. A method as defined in claim 6 wherein the step of determining the vertical distance between the reference level and the top level of the first chip further comprises the step of applying the adhesive to the top surface of the first chip to establish the top level of the first chip as the surface provided by the first chip on which the light beam is incident.

10. A method as defined in claim 3 wherein the step of determining the vertical distance between the reference level and the top level of the first chip further comprises the following steps:

a. providing a reference surface at a known distance below the reference level;

b. providing an autofocus system above the reference surface;

c. directing the autofocus system toward the reference surface and noting a resulting first configuration of the autofocus system;

d. positioning the first chip above the reference surface and below the autofocus system;

e. directing the autofocus system toward a surface provided by the first chip and noting a resulting second configuration of the autofocus system; and f. calculating the vertical distance between the reference surface and the surface provided by the first chip, using information obtained from the first and second configurations of the autofocus system.

11. A method as defined in claim 10 wherein the step of providing an autofocus system comprises providing a light autofocus system.

12. A method as defined in claim 10 wherein the step of providing an autofocus system comprises providing an ultrasound autofocus system.

13. A method as defined in claim 10 wherein the step of determining the vertical distance between the reference level and the top level of the first chip further comprises the following steps:

a. providing the top surface of the first chip as the surface provided by the first chip toward which the autofocus system is directed; and b. thereafter, applying the adhesive to the top surface of the first chip to a selected thickness.

14. A method as defined in claim 10 wherein the step of determining the vertical distance between the reference level and the top level of the first chip further comprises the step of applying the adhesive to the top surface of the first chip to establish the top level of the first chip as the surface provided by the first chip toward which the autofocus system is directed.

15. A method as defined in claim 3 wherein the step of determining the vertical distance between the reference level and the top level of the first chip further comprises the following steps:

a. providing a mechanical sensing system comprising a head, a scale whereby the vertical position of the head relative to the reference level may be determined, and a strain gauge that responds when the head contacts an object; and b. lowering the head until contact by the head with a surface provided by the first chip is sensed by the strain gauge, and using the scale to determine the vertical distance between the reference level and the level at which the mechanical sensing system detected the surface provided by the first chip.

16. A method as defined in claim 15 wherein the step of determining the vertical distance between the reference level and the top level of the first chip further comprises the step of applying the adhesive to the top surface of the first chip to a selected thickness.

17. A method as defined in claim 1 in which the steps of engaging, supporting, manipulating, and releasing the second chip are performed using a vacuum system comprising a vacuum tube on the end of which the second chip is carried, and a scale whereby the vertical position of the second chip, carried by the vacuum tube, relative to the reference level may be determined.

18. A method as defined in claim 1 in which the steps of engaging, supporting, manipulating, and releasing the second chip are performed using a mechanical grasping system.

19. A method as defined in claim 1 in which the step of manipulating the second chip is performed using a scale fixed relative to the vertical reference level to determine the vertical distance between the vertical reference level and level of the bottom of the second chip.

* * * * *